(12) United States Patent
Yamasaki et al.

(10) Patent No.: US 7,632,884 B2
(45) Date of Patent: Dec. 15, 2009

(54) RESIN COMPOSITION FOR COMPOSITE DIELECTRIC MATERIAL, COMPOSITE DIELECTRIC MATERIAL AND ELECTRIC CIRCUIT BOARD USING THE SAME

(75) Inventors: Hayahide Yamasaki, Soraku-gun (JP); Yoshinobu Asako, Amagasaki (JP); Kazushi Omote, Nara (JP); Ai Nishichi, Osaka (JP)

(73) Assignee: Nippon Shokubai Co., Ltd., Osaka-shi (JP)

( * ) Notice: Subject to any disclaimer, the term of this patent is extended or adjusted under 35 U.S.C. 154(b) by 423 days.

(21) Appl. No.: 10/950,454

(22) Filed: Sep. 28, 2004

(65) Prior Publication Data

US 2005/0101714 A1 May 12, 2005

(30) Foreign Application Priority Data

Sep. 30, 2003 (JP) .............................. 2003-338973

(51) Int. Cl.
*C08K 3/10* (2006.01)
(52) U.S. Cl. ...................... 524/406; 524/413; 524/434; 524/520; 524/537; 528/219
(58) Field of Classification Search ................ 524/406, 524/413, 434, 520, 537; 528/219
See application file for complete search history.

(56) References Cited

U.S. PATENT DOCUMENTS

| | | | | |
|---|---|---|---|---|
| 2,764,718 | A * | 9/1956 | Peck et al. ................... 361/313 |
| 4,518,737 | A * | 5/1985 | Traut ............................ 524/413 |
| 5,114,780 | A | 5/1992 | Mercer et al. |
| 5,115,082 | A * | 5/1992 | Mercer et al. ................ 528/219 |
| 5,275,878 | A | 1/1994 | Yamakawa et al. |
| 5,739,193 | A * | 4/1998 | Walpita et al. ............... 524/413 |
| 6,207,764 | B1 | 3/2001 | Ignatz-Hoover |
| 6,407,453 | B1 | 6/2002 | Watanabe et al. |
| 6,599,631 | B2 * | 7/2003 | Kambe et al. ................ 428/447 |
| 6,706,136 | B2 | 3/2004 | Taniguchi et al. |
| 7,049,393 | B2 * | 5/2006 | Ding et al. ................... 528/488 |
| 7,164,197 | B2 * | 1/2007 | Mao et al. .................... 257/700 |

(Continued)

FOREIGN PATENT DOCUMENTS

EP     1 178 072 A2     2/2002

(Continued)

OTHER PUBLICATIONS

Xiao-Hui Wang et al. "THe grain size effect on dielectric properties of BaTiO3 based ceramics".Materials Science and Engineering B99 (2003) 199-202.*

(Continued)

*Primary Examiner*—Petet D. Mulcahy
*Assistant Examiner*—Henry Hu
(74) *Attorney, Agent, or Firm*—Connolly Bove Lodge & Hutz LLP

(57) ABSTRACT

It is an object of the present invention to provide a liquid composition for an organic-inorganic composite dielectric excellent in dispersibility of an inorganic dielectric in an organic polymer and exhibiting a high dielectric constant in the case where the composition is used for producing an organic-inorganic composite dielectric.

The present invention is directed to a liquid composition for a composite dielectric, which comprises an inorganic dielectric and a fluorinated aromatic polymer.

12 Claims, 1 Drawing Sheet

U.S. PATENT DOCUMENTS

| | | | |
|---|---|---|---|
| 2002/0115815 A1* | 8/2002 | Lee et al. ............... | 528/171 |
| 2003/0029634 A1 | 2/2003 | Okamoto et al. | |

FOREIGN PATENT DOCUMENTS

| | | | |
|---|---|---|---|
| JP | 2-225358 A | | 9/1990 |
| JP | 05-094717 A | | 4/1993 |
| JP | 05-128912 A | | 5/1993 |
| JP | 5-503112 A | | 5/1993 |
| JP | 5-506042 A | | 9/1993 |
| JP | 11-260148 | | 9/1999 |
| JP | 2002-060595 A | | 2/2002 |
| JP | 2002-344100 A | | 11/2002 |
| JP | 2003-138026 | * | 5/2003 |
| JP | 2003-138026 A | | 5/2003 |
| JP | 2003-193009 | | 7/2003 |
| JP | 2009-16169 | * | 1/2009 |
| TW | 330943 | | 5/1998 |
| TW | 485475 | | 5/2002 |
| WO | WO-91/09071 A1 | | 6/1991 |
| WO | WO 91/16369 A1 | | 10/1991 |
| WO | WO 92/18213 | * | 10/1992 |
| WO | WO-2005/033209 A1 | * | 4/2005 |

OTHER PUBLICATIONS

Study on the Dielectric Property of PVDF/BaTiO3 Composite, Xiong Chuan-xi, et al, Polymeric Materials Science & Engineering. 19(1), Jan. 2003.

First Notification of Office Action issued in counterpart Chinese Application No. 200480028531.6 on Jun. 6, 2008 with English translation.

* cited by examiner (a)          (b)

RESIN COMPOSITION FOR COMPOSITE DIELECTRIC MATERIAL, COMPOSITE DIELECTRIC MATERIAL AND ELECTRIC CIRCUIT BOARD USING THE SAME

TECHNICAL FIELD

The present invention relates to a liquid composition for an organic-inorganic composite dielectric, composed of an organic polymer and an inorganic dielectric, a composite dielectric made of the composition, and an electrical circuit substrate using the dielectric.

BACKGROUND ART

Along with development of information technology in society, requirement of higher information transmission speed and, accordingly, shift of the information signals to higher frequency is increasing. In order to deal with the requirements, electrical circuit substrates to be used for electronic products have been required to be highly functional and highly integrated. In order to solve these problems, EPD (Embedded Passive Device Technology) that is a technology for fabricating the electronic devices such as resistors, capacitors and inductors in circuit substrates has drawn attention.

In general, a ceramic dielectric is used for the capacitor to be mounted. In the case of employing the ceramic dielectric in the EPD, inferior post-processibility for boring and cutting of the circuit substrate and inferior adhesion property become problems. Therefore, an organic-inorganic composite dielectric comprising an organic polymer and an inorganic dielectric combined with each other is proposed as a dielectric excellent in the post-processibility and the adhesion property.

The organic-inorganic composite dielectric is a formed body or film produced by dispersing an inorganic dielectric with a high dielectric constant in a polyphenylene oxide resin, an epoxy resin or the like (see Japanese Kokai Publication Hei-02-225358) and such a resin has a low dielectric constant especially in high frequency region, so that it is necessary to add the inorganic dielectric with high dielectric constant as much as possible. However, the polyphenylene oxide resin and the epoxy resin, which have been conventionally used, are inferior in dispersibility of the inorganic dielectric; therefore, the addition amount is limited and the obtained dielectric constant as a composite dielectric has not yet reached to a satisfactory level.

SUMMARY OF THE INVENTION

Therefore, it is an object of the present invention to provide a liquid composition for an organic-inorganic composite dielectric excellent in dispersibility of an inorganic dielectric in an organic polymer and exhibiting a high dielectric constant in the case where the composition is used for producing an organic-inorganic composite dielectric.

In order to solve the above problems, a liquid composition for a composite dielectric according to the present invention comprises an inorganic dielectric and a fluorinated aromatic polymer. If the fluorinated aromatic polymer is used as an organic polymer, the fluorinated aromatic polymer is excellent in dispersibility of the inorganic dielectric; therefore, the inorganic dielectric can be added in high concentration in the composition and a composite dielectric having a high dielectric constant can be obtained. Consequently, a composite dielectric made of the liquid composition for a composite dielectric of the present invention is especially suitable for uses, among uses of composite dielectrics, electronic devices such as capacitors composing electrical circuit substrates.

In order to obtain the composite dielectric with high dielectric constant, the above composition is preferable to comprise the inorganic dielectric within a range of 100 to 2,000 parts by mass relative to 100 parts by mass of the fluorinated aromatic polymer.

Further, a composite dielectric made of the above liquid composition for a composite dielectric, and an electrical circuit substrate comprising the composite dielectric as a constituent part are also included in the present invention.

Herein, the composite dielectric of the present invention denotes a body formed into a prescribed shape made of the liquid composition in which the inorganic dielectric is dispersed, and includes a formed body and a formed film in which the inorganic dielectric is dispersed high in an organic polymer.

DETAILED DESCRIPTION OF THE INVENTION

The present inventors made various investigations concerning a liquid composition for an organic-inorganic composite dielectric comprising an inorganic dielectric dispersed in an organic polymer, they have found that use of a fluorinated aromatic polymer as an organic polymer makes it possible to increase the addition amount of the inorganic dielectric in the composition and, accordingly, to improve greatly the dielectric constant of the composite dielectric, particularly in a high frequency region. Consequently, the above issues could be resolved successfully.

A liquid composition for a composite dielectric of the present invention comprises a fluorinated aromatic polymer and an inorganic dielectric. In the liquid composition for a composite dielectric of the present invention, the contents of the fluorinated aromatic polymer and the inorganic dielectric are preferable to satisfy that the inorganic dielectric is within a range of 100 to 2,000 parts by mass relative to 100 parts by mass of the fluorinated aromatic polymer. If the content of the inorganic dielectric is less than 100 parts by mass, the dielectric constant of a composite dielectric made of the liquid composition may be decreased. On the other hand, if the content of the inorganic dielectric exceeds 2,000 parts by mass, the viscosity of the composition is increased and handling of the composition probably becomes difficult. The lower limit of the content of the inorganic dielectric is preferably not less than 500 parts by mass, more preferably not less than 700 parts by mass, relative to 100 parts by mass of the fluorinated aromatic polymer. The upper limit of the content of the inorganic dielectric is preferably not more than 1,500 parts by mass, more preferably not more than 1,000 parts by mass, relative to 100 parts by mass of the fluorinated aromatic polymer.

The liquid composition for a composite dielectric of the present invention may comprise one or more species of fluorinated aromatic polymers and inorganic dielectrics respectively.

The fluorinated aromatic polymer in the present invention is preferable to have a glass transition temperature of not less than 150° C. If the glass transition temperature is less than 150° C., the heat resistance of the composite dielectric made of the liquid composition may be deteriorated. The glass transition temperature of the fluorinated aromatic polymer is more preferably within a range of 150° C. to 400° C., most preferably within a range of 170° C. to 300° C. The glass transition temperature can be measured, for example, by using a DSC (product name: "DSC 6200", manufactured by SEIKO INSTRUMENTS INC.) in a temperature increase condition of 20° C./min under nitrogen atmosphere.

The surface resistance value of the fluorinated aromatic polymer of the present invention is preferably not less than $1.0 \times 10^{15}$ $\Omega/cm^2$. If the surface resistance value is less than $1.0 \times 10^{15}$ $\Omega/cm^2$, the insulation property of the composite dielectric made of the liquid composition may be deteriorated. The surface resistance value of the fluorinated aromatic polymer is more preferably $1.0 \times 10^{17}$ $\Omega/cm^2$ or more. The surface resistance value can be measured, for example, by using a resistance value measurement apparatus (product name: "High Resistance Meter 4329A & Resistivity Cell 16008A", manufactured by HEWLETT PACKARD) in the measurement voltage condition of 500 V.

The average molecular weight of the fluorinated aromatic polymer of the present invention is preferably within a range of 5,000 to 500,000 on the basis of the number average molecular weight (Mn). If the number average molecular weight is less than 5,000, the heat resistance of the composite dielectric made of the liquid composition may be deteriorated. If the number average molecular weight exceeds 500,000, the viscosity of the resin composition is increased to deteriorate the workability.

The above number average molecular weight (Mn) is further preferably within a range of 10,000 to 200,000, most preferably 10,000 to 100,000. The number average molecular weight can be measured, for example, by using a gel permeation chromatographic analyzer (GPC) (product name: "HLC-8120 GPC", manufactured by TOSOH CORPORATION), G-5000 HXL+GMHXL-L as columns, THF as a development solvent, and standardized polystyrenes for standards in a flow rate condition of 1 mL/min.

The fluorinated aromatic polymer of the present invention is a polymer comprising a repeating unit including an aromatic ring having at least one fluorine group, and at least one bond selected from the group consisting of an ether bond, a ketone bond, a sulfone bond, an amido bond, an imido bond and an ester bond. Specific examples thereof may include fluorine atom-containing polyimides, polyethers, polyether imides, polyether ketones, polyether sulfones, polyamide ethers, polyamides, polyether nitrites, polyesters and the like.

The fluorinated aromatic polymer of the present invention is preferably a polymer comprising essentially a repeating unit including an aromatic ring having at least one fluorine group, and at least one ether bond. The fluorinated aromatic polymer of the present invention is preferably a fluorine atom-containing polyaryl ether including the repeating unit represented by the following general formula (1). If the fluorine-containing aromatic polymer has such a structure, it is supposed that the mutual reaction with the inorganic dielectric is properly suppressed and, thus, phenomena to be obstacles in production of the liquid composition for a composite dielectric such as considerable increase of the viscosity, gelation, loss of fluidity, agglomeration can be suppressed. Accordingly, it is made possible to produce the liquid composition for a composite dielectric, in which a larger amount of the inorganic dielectric is contained. That composition gives the composite dielectric with higher dielectric constant and in addition, since the viscosity can be decreased, formation of the composite dielectric into a thin film-like body becomes easy. Repeating units represented by the general formula (1) may be same or different and may be in any form of block or random state and the like.

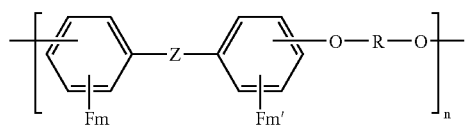

(In the formula, R is same or different and represents divalent organic chain of 1 to 150 carbon atoms having an aromatic ring, Z represents a divalent chain or direct bond, m and m' respectively are same or different and each represents numbers of fluorine atoms bonded to the aromatic rings and are an integer of not less than 0 and m+m'=1 to 8, n represents the polymerization degree and is preferably within a range of 2 to 5000 and more preferably within a range of 5 to 500.)

In the general formula (1), m+m' is preferably within a range of 2 to 8, more preferably within a range of 4 to 8.

In the general formula (1), the position of the ether structure part (—O—R—O—) bonded to the aromatic ring is preferably para-position with respect to Z.

In the general formula (1), R represents a divalent organic chain and is preferably any one represented by the following structural formula groups (2) or an organic chain formed by combining these groups.

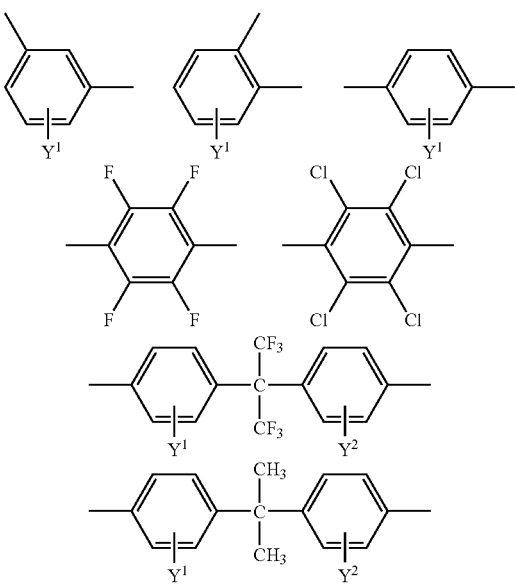

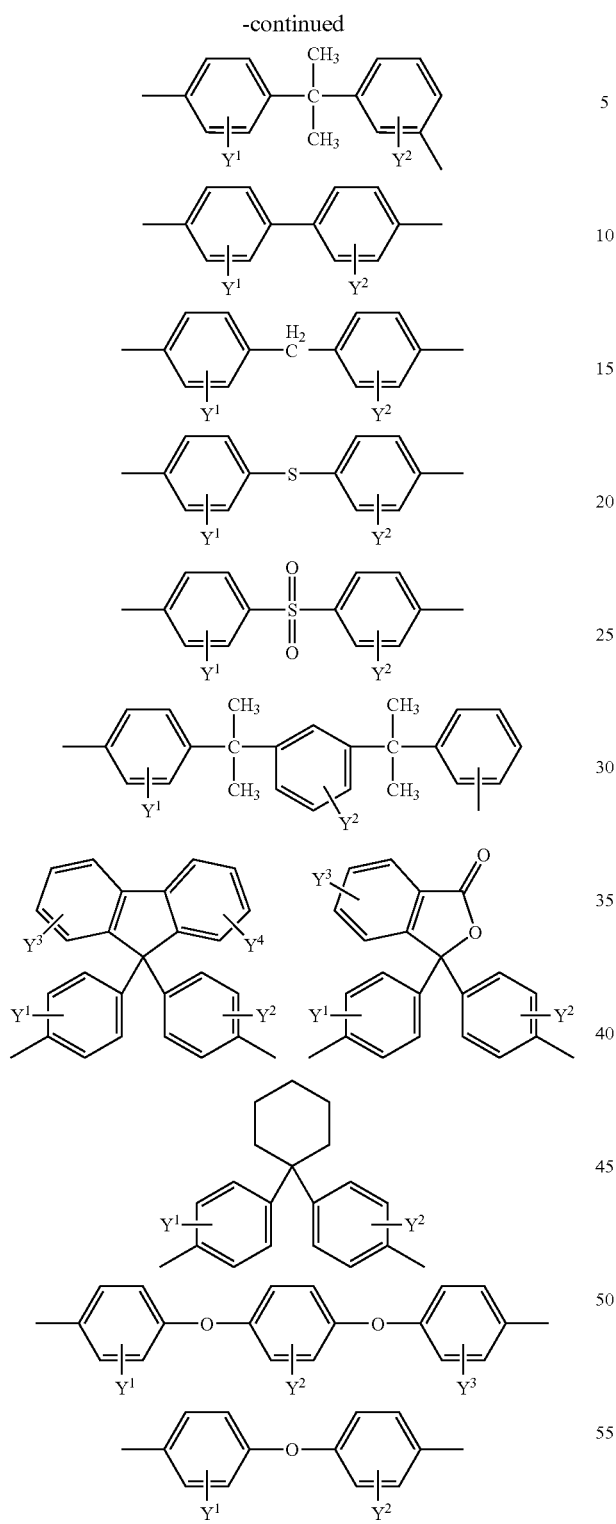
(In the formulas, $Y^1$ to $Y^4$ are same or different and each represents a hydroxyl group or a substituent group, and the substituent groups are alkyl or alkoxy group.)
Specific examples of preferable groups for R may include organic chains represented by the following structural formula groups (3).
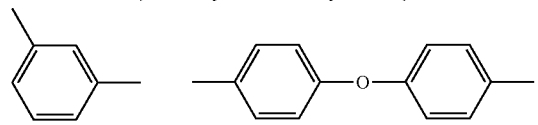

In the general formula (1), Z represents a divalent chain or direct bond. As the divalent chain, for example, the chains represented by the following structural formula groups (4) are preferable.

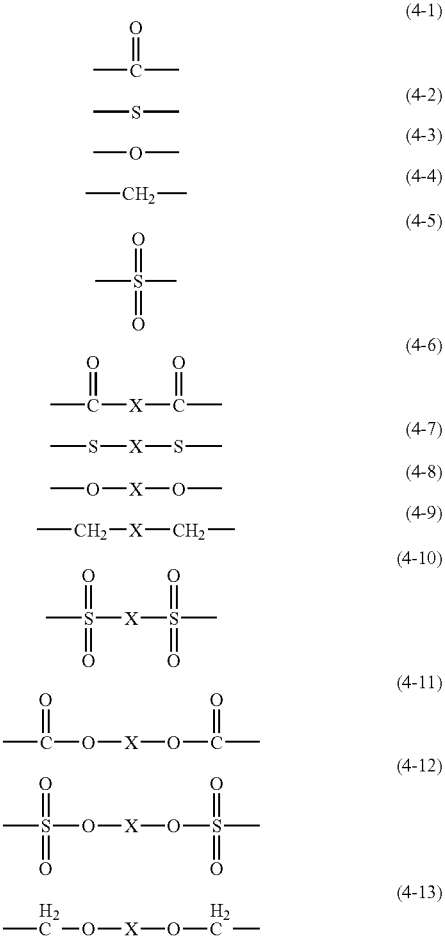

(In the formula, X represents a divalent organic chain having 1 to 50 carbon atoms.)

Examples of the above X may include, for example, the organic chains represented by the structural formula groups (3) and, among these, diphenyl ether chain, bisphenol A chain, bisphenol F chain and fluorene chain are preferable.

A synthesis method of the fluorinated aromatic polymer of the present invention may be a method using a common polymerization reaction, and examples thereof may include condensation polymerization, addition polymerization, solution polymerization, suspension polymerization, emulsion polymerization and the like. The reaction conditions such as reaction temperature and the reaction time of the polymerization reaction may be set properly. The polymerization reaction is preferably carried out under nitrogen atmosphere.

For example, with respect to a synthesis method of a fluorine atom-containing polyaryl ether including the repeating unit represented by the general formula (1), in the case of obtaining a fluorine atom-containing polyaryl ether including the repeating unit, wherein Z is (4-6) among the structural formula groups (4) and X is diphenyl ether chain, there may be mentioned a method of heating 4,4'-bis(2,3,4,5,6-pentafluorobenzoyl)diphenyl ether (hereinafter, referred to as "BPDE") and a divalent phenol compound in an organic solvent in the presence of a basic compound.

The reaction temperature in the above synthesis method is preferably within a range of 20 to 150° C., further preferably within a range of 50 to 120° C.

Examples of the organic solvent to be used in the above synthesis method may include polar solvents such as N-methyl-2-pyrrolidone (NMP), N,N-dimethylacetamide and methanol, and aromatic solvents such as toluene.

Examples of the basic compound to be used in the above synthesis method may include potassium carbonate, lithium carbonate, potassium hydroxide and the like.

In the above synthesis method, examples of the divalent phenol compound may include 2,2-bis(4-hydroxyphenyl)-1,1,1,3,3,3-hexafluoropropane (hereinafter, referred to as "6FBA"), bisphenol A (hereinafter, referred to as "BA"), 9,9'-bis(4-hydroxyphenyl)fluorene (hereinafter, referred to as "HF"), bisphenol F, hydroquinone, resorcinol and the like.

The amount of use of the above divalent phenol compound is preferably within a range of 0.8 to 1.2 mole, more preferably within a range of 0.9 to 1.1 mole, relative to 1 mole of 4,4'-bis(2,3,4,5,6-pentafluorobenzoyl)diphenyl ether.

In the above synthesis method, the solvent is removed from the reaction solution after the completion of the reaction and, if necessary, the remained product is washed to obtain the fluorinated aromatic polymer. Also, a solvent in which the fluorinated aromatic polymer has low solubility may be added to the reaction solution to precipitate the polymer, and the precipitated product is separated by filtration to obtain the polymer.

As the inorganic dielectric in the present invention, $ABO_3$ type dielectrics having perovskite type crystal structure and their binary or ternary composite perovskite type dielectrics are preferable and also titanium oxide can be used.

Examples of the above $ABO_3$ type dielectrics may include, for example, lead titanate $PbTiO_3$, lead tungstate $PbWO_3$, lead zinc oxide $PbZnO_3$, lead iron oxide $PbFeO_3$, lead magnesium oxide $PbMgO_3$, lead niobate $PbZbO_3$, lead nickel oxide $PbNiO_3$, lead zirconate $PbZrO_3$, barium titanate $BaTiO_3$, strontium titanate $SrTiO_3$, calcium zirconate $CaZrO_3$, calcium titanate $CaTiO_3$, zinc titanate $ZnTiO_3$, magnesium titanate $MgTiO_3$, barium zirconate $BaZrO_3$, magnesium zirconate $MgZrO_3$, zinc zirconate $ZnZrO_3$ and the like.

Examples of the above binary or ternary composite perovskite type dielectrics may include, for example, $(Ba_xSr_{(1-x)})(Sn_yTi_{(1-y)})O_3$, $Ba(Ti_xSn_{(1-x)})O_3$, $Ba_xSr_{(1-x)}TiO_3$, $BaTiO_3$—$CaZrO_3$, $BaTiO_3$—$Bi_4Ti_3O_{12}$, $(Ba_xCa_{(1-x)})(Zr_yTi_{(1-y)})O_3$ and the like.

The shape of the inorganic dielectric of the present invention may be granular, fibrous, scaly, conical and the like.

The average particle size of the above inorganic dielectric may properly be selected in consideration of the thickness of a composite dielectric made of the liquid composition. In the case of using the composition for a composite dielectric in form of a thin film, the size is preferably within a range of 0.01 to 10 µm, more preferably within a range of 0.1 to 5 µm, most preferably within a range of 0.5 to 3 µm. The specific surface area of the inorganic dielectric per volume is preferably within a range of 1 m²/g to 10 m²/g, more preferably within a range of 2 m²/g to 8 m²/g, most preferably, 2 m²/g to 5 m²/g.

In order to improve the formability and film formability and adjust the viscosity, it is preferable to add a solvent to the liquid composition for a composite dielectric of the present invention.

Examples of the above solvent may include aromatic solvents such as toluene, xylene, nitrobenzene and benzonitrile; ketone type solvents such as acetone, methyl ethyl ketone, cyclohexanone, cyclopentanone and isobutyl ketone; methanol, ethanol, N-methyl-2-pyrrolidone (NMP), N,N-dimethylacetamide, acetonitrile and the like.

Also, a solvent mixture containing a number of solvents in combination may be used for increasing the stability of the liquid composition for a composite dielectric, adjusting the drying property, or improving the physical properties of formed product and formed film.

The addition amount of the above solvent is preferably within a range of 1 to 70% by mass in the liquid composition. If the addition amount of the solvent is less than 2% by mass, the viscosity decrease of the liquid composition is not sufficient and the formability may be deteriorated. On the other hand, if it exceeds 70% by mass, the solvent may remain in the composite dielectric to decrease the dielectric constant. The addition amount of the solvent is more preferably within a range of 2 to 60% by mass, most preferably within a range of 3 to 50% by mass.

The liquid composition for a composite dielectric of the present invention may further contain other compounds and auxiliary materials, if necessary. Examples of the other compounds and auxiliary materials may include resin such as polyamide resin, polyamide imide resin, epoxyresin, phenol resin and fluorine resin, inorganic fillers such as silica, alumina, aluminum hydroxide, glass and graphite, a silane coupling agent, a titanate coupling agent, a flame retardant, an antioxidant, a plasticizer, a leveling agent, a repelling prevention agent, a dispersant and the like.

The addition amount of the above other compounds and the auxiliary materials in the liquid composition for a composite dielectric of the present invention is not limited as long as it is to the extent in which the effects of the present invention are not adversely affected and it is preferably within a range of 0.001 to 500 parts by mass relative to 100 parts by mass of the composition.

The method of forming the composite dielectric made of the liquid composition for a composite dielectric of the present invention may be selected properly depending on the shape of the composite dielectric to be desired.

For example, in the case of using the composite dielectric in the form of a thin layer (thin film), the liquid composition is applied to a film, a substrate or a metal foil by casting, dipping coating, spin coating, roll coating, spray coating, bar coating, screen printing, flexo-printing and the like to form a film, and then the solvent is dried to form a thin layer.

The composite dielectric of the present invention is preferable to have a relative dielectric constant within a range of 30 to 10,000. If the relative dielectric constant is less than 30, the capacity of storing electric charge as a capacitor of the dielectric may be decreased. The relative dielectric constant of the composite dielectric is more preferably within a range of 60 to 10,000, most preferably within a range of 80 to 10,000. The relative dielectric constant can be measured together with a dielectric dissipation factor by an impedance analyzer (product name: "HP 4294A", manufactured by HEWLETT PACKARD).

The composite dielectric of the present invention is required to have generally needed characteristics as a substrate device and is preferable to have a heat loss ratio of not more than 1.0% by mass up to 300° C. by TG-DTA analysis and a moisture absorption ratio of not more than 1.0% by mass by a pressure cooker test (PCT test, at 135° C. and 3 atm for 2 hours). The TG-DTA analysis can be carried out by measuring the weight loss from a room temperature to 300° C. at 10° C./min temperature increase rate under nitrogen atmosphere by using a thermal analyzer (TG-DTA) (product name; "Shimadzu Thermogravimetry/Differential Thermal Analyzer", manufactured by SHIMADZU CORPORATION). The PCT test can be carried out by measuring the moisture absorption ratio after a dried sample is exposed at 135° C. and 3 atm for 2 hours by using a pressure cooker (product name: "PC-242 HS Pressure Cooker", manufactured by HIRAYAMA CO., LTD.)

The thickness is preferably within a range of 0.1 to 100 μm, more preferably within a range of 0.5 to 50 μm, when the composite dielectric of the present invention is used in the form of a thin layer (thin film).

Examples of the uses and functions of the composite dielectric of the present invention may include a bypass capacitor, a charging element, a differentiation element, a terminal load element, a filter, an antenna, noise cut and the like.

Since the composite dielectric of the present invention can be used for a charging element, a differentiation element, and a terminal load element, it is preferably used as a component constituting an electrical circuit substrate. The electrical circuit substrate comprising the composite dielectric of the present invention as a constituent part is also included in the present invention. The electrical circuit substrate comprising the composite dielectric of the present invention as a constituent part may be a built-up substrate comprising a substrate device made of the composite dielectric installed on the outside of the substrate and an embedded passive device substrate (EPD substrate) comprising the substrate device embedded in the substrate. Also, the electrical circuit substrate may be a thin type multilayer flexible sheet device constituted from a substrate device made of the composite dielectric of the present invention and other various devices in form of thin films, which are electrically connected one another so as to form three-dimensional circuits, laminated on a film-like substrate (flexible substrate). The electrical circuit substrate may further comprise other elements such as wiring, terminals and holes other than the various electronic devices and the types of the electronic devices and other elements comprised in the substrate, the positions and shapes of the electronic devices and electrodes comprised in the substrate, and the positions of the wiring and holes may be selected properly depending on the uses and functions of the electrical circuit substrate.

The electrical circuit substrate including the composite dielectric of the present invention as a constituent part can be produced by arranging wiring layers and electrodes on the surface or in the inside of the thin film formed by the above-mentioned method.

The above-mentioned electrical circuit substrate is produced by forming an earth electrode on an insulating substrate, forming a thin film of the composite dielectric of the present invention on the earth electrode, and further arranging a wiring layer on the surface or in the inside of the thin film.

Also, the electrical circuit substrate may be produced by applying or attaching the composite dielectric of the present invention to a conductive material such as a metal foil or by inserting the composite dielectric between conductive materials.

The liquid composition for a composite dielectric of the present invention can apply to a wide area, apply evenly, application to a specified portion, or forming pattern by printing. Additionally, the liquid composition also has an advantageous point that it can be made to be a thin film for promoting miniaturization and improvement of capacity density.

Further, working such as drilling by laser, a solvent, or etching, patterning and removal of composite dielectric the above-mentioned can be conducted to the electrical circuit substrate.

In the case of forming an earth electrode in the electrical circuit substrate of the present invention, the earth electrode is formed in a portion or the entire surface of an insulating substrate and may be formed by a method such as vapor deposition, plating, sputtering, etching, and screen printing methods using a material such as chromium, copper, aluminum, tungsten, silver, platinum, and gold.

In the electrical circuit substrate of the present invention, as the wiring layer, there may be mentioned wiring layers comprising strip lines, micro strip lines, triplate lines, and co-planer lines and the like. As a method for forming the wiring layer, for example, after forming the earth electrode and the thin layer of the composite dielectric on the insulating substrate in the above-mentioned manner, the wiring layer is formed by vapor deposition, plating, sputtering, etching, and screen printing methods using a material such as chromium, copper, aluminum, tungsten, silver, platinum, and gold. The electrical circuit substrate formed in such a manner is shown in FIG. 1.

As practical embodiments of the electrical circuit substrate of the present invention and practical examples of the production method of the substrates, there may be mentioned those described in "Special Topic 1: Newest Technology and Future Aspects of Electronic Part-Built-in Substrates, Electronic Materials", published on September 2002. Followings are the examples of the various forms and production methods and the like of the electrical circuit substrate comprising a capacitor embedded in a substrate.

(1) An electrical circuit substrate which is produced by a step of forming a capacitor by sticking a metal foil such as a Cu foil on the upper and the lower sides of a thin membrane (film) of the composite dielectric, and a step of forming an electrical circuit substrate by laminating wiring layers on the upper and the lower sides of the capacitor.

(2) An electrical circuit substrate which is produced by a step of forming a composite dielectric layer on a lower electrode stuck to the upper side or both upper and lower sides of a resin substrate and sticking an upper electrode to the dielectric layer, and a step of forming a wiring layer on the resin substrate, on the upper side or both upper and lower sides of which the capacitor is formed, by laminating and etching.

(3) An electrical circuit substrate which is produced by a step of forming a capacitor by forming a dielectric layer on a metal foil such as a Cu foil and sticking a metal foil such as a Cu foil on the dielectric layer, a step of reversing the entire parts of the capacitor formed on the metal foil such as a Cu foil and the metal foil, and laminating it on a resin substrate of which a metal foil such as a Cu foil is stuck on a bottom side, and a step of forming electric circuits by etching the metal foils such as Cu foils on the upper and lower sides of the resin substrate, laminating and etching wiring layers on both sides.

Examples of the composite dielectric, a part for an electric circuit (the electronic device) produced from the composite dielectric of the present invention, and the electrical circuit substrate in which the electronic device is embedded are schematically shown in FIG. 2 and FIG. 3. FIG. 2A is a figure schematically showing one example of the composite dielectric produced from a liquid composition for a composite dielectric of the present invention. FIG. 2B is a figure schematically showing one example of the part for the electric circuit (the electronic device) produced by sticking electrodes on upper and lower sides of the composite dielectric. The shape of the composite dielectric, and the shapes or the installation positions of the electrodes may properly be set depending on uses or functions of the composite dielectric. FIG. 3 is a figure schematically showing an example of the electrical circuit substrate in which the electronic device is embedded. The installation position or the number of electronic devices in the substrate may properly be set depending on uses and functions of the electrical circuit substrate and on the upper and lower sides and/or in the inside of the substrate, other parts such as IC chips may be disposed based on the necessity.

Figure 1:
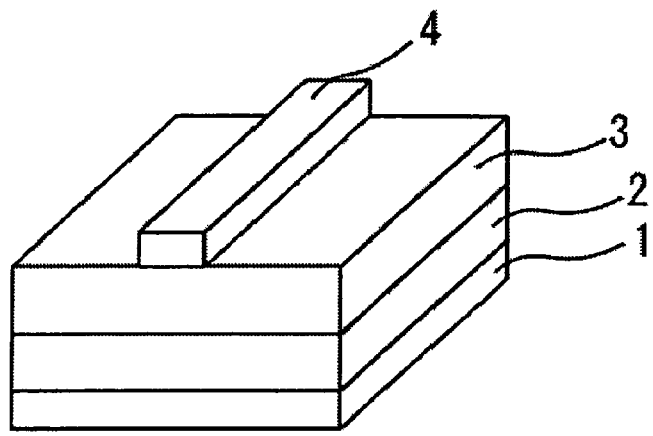
FIG. 1 shows a perspective view of a substrate as an embodiment of an electrical circuit substrate of the present invention.
Figure 2:
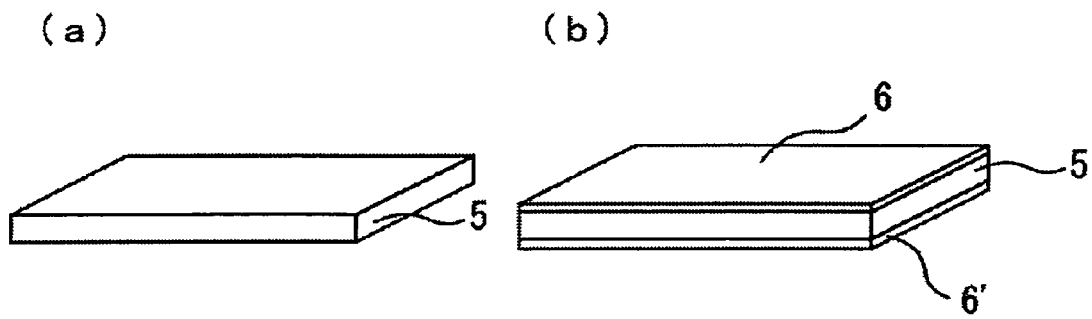
FIG. 2(a) schematically shows a composite dielectric of the present invention and FIG. 2(b) schematically shows a part for an electric circuit (electronic device) formed from the composite dielectric.
Figure 3:
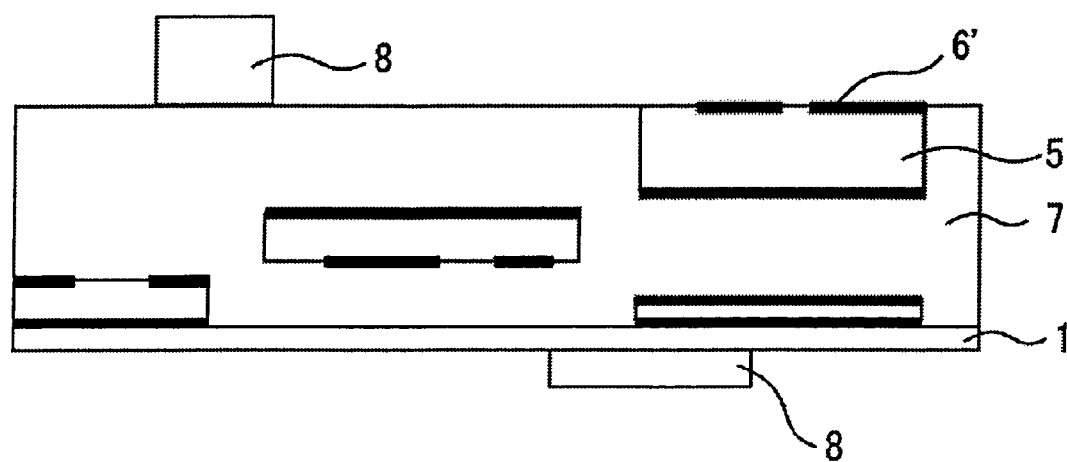
FIG. 3 schematically shows an electrical circuit substrate in which a part for an electric circuit (electronic device) formed from the composite dielectric of the present invention is embedded.

EXPLANATION OF SYMBOLS 1 insulating substrate
2 earth electrode
3 composite dielectric layer
4 wiring layer
5 composite dielectric
6, 6' electrode
7 substrate
8 another component (IC chip or the like).

The liquid composition for a composite dielectric of the present invention is constituted as described above, the liquid composition is excellent in dispersibility and high filling property of the inorganic dielectric in the organic polymer and the inorganic dielectric can be added therein in high concentration. In addition, the liquid composition can form a thin film. Therefore, the composite dielectric made of the liquid composition for a composite dielectric of the present invention has a high dielectric constant and a capacity density. Further, since a fluorinated aromatic polymer has high insulating property, high heat resistance and low moisture absorbing property, the composite dielectric made of the liquid composition for a composite dielectric of the present invention has the low dielectric dissipation factor, the high heat resistance and the low moisture absorbing property.

Since the composite dielectric made of the liquid composition for a composite dielectric of the present invention has the high insulating property, the low dielectric dissipation factor and the high heat resistance, it is useful for EPD (Embedded Passive Device Technology) as well as various electronic devices such as a bypass capacitor, a charging element, a differentiation element, a terminal load element, a filter, an antenna and the like.

BEST MODE FOR CARRYING OUT THE INVENTION

The present invention will be explained in detail below by way of Examples, but the present invention is not limited to these Examples. Unless indicated otherwise, "%" means "% by weight", and "part" means "part by weight".

SYNTHESIS EXAMPLE 1

16.74 parts of BPDE, 10.14 parts of 6-FBA, 4.34 parts of potassium carbonate and 90 parts of N-methyl-2-pyrrolidone (NMP) were charged in a rector equipped with a thermometer, a cooling tube, a gas inlet tube and a stirrer. The mixture was heated to 60° C. and reacted for 5 hours. After completion of the reaction, while being strongly stirred by blender, the reaction solution was added to an aqueous 1% acetic acid solution. The precipitated product was separated by filtration, washed with distilled water and methanol, and vacuum dried to obtain a fluorinated aromatic polymer (1). The obtained polymer had a glass transition temperature (Tg) of 193° C., a number average molecular weight (Mn) of 72,370 and a surface resistance value of not less than $1.0 \times 10^{18}$ $\Omega/cm^2$.

SYNTHESIS EXAMPLE 2

16.74 parts of BPDE, 10.5 parts of HF, 4.34 parts of potassium carbonate and 90 parts of dimethylacetamide were charged in the same reactor as that of Synthesis Example 1. The mixture was heated to 80° C. and reacted for 8 hours. After completion of the reaction, a fluorinated aromatic polymer (2) was obtained in the same manner as Synthesis Example 1. The obtained polymer had a glass transition temperature (Tg) of 242° C., a number average molecular weight (Mn) of 70,770 and a surface resistance value of not less than $1.0 \times 10^{18}$ $\Omega/cm^2$.

SYNTHESIS EXAMPLE 3

16.74 parts of BPDE, 5.88 parts of BA, 4.34 parts of potassium carbonate and 90 parts of dimethylacetamide were charged in the same reactor as that of Synthesis Example 1. The mixture was heated to 80° C. and reacted for 10 hours. After completion of the reaction, a fluorinated aromatic polymer (3) was obtained in the same manner as Synthesis Example 1. The obtained polymer had a glass transition temperature (Tg) of 180° C., a number average molecular weight (Mn) of 62,750 and a surface resistance value of not less than $1.0 \times 10^{18}$ $\Omega/cm^2$.

EXAMPLES 1 TO 9, COMPARATIVE EXAMPLES 1 TO 3

As liquid compositions for a composite dielectric according to the present invention, liquid compositions were obtained by adding the fluorinated aromatic polymers, the organic solvents, the dispersant and the inorganic dielectric in this order in the respective amounts shown in Table 1 and stirring the mixtures by a chemi-stirrer. Also, as liquid compositions for comparison, the compositions were obtained by mixing the materials in the respective amounts shown in Table 2 in the same manner.

Next, after each of the above compositions was applied by a spin coater to a glass substrate on which a platinum film was previously formed and dried for 30 minutes at a room temperature and further dried at a prescribed temperature in an oven to form a composite dielectric of 20 μm thickness. Further, a platinum film was formed on the surface of the composite dielectric by ion sputtering to obtain the composite dielectric for evaluation. Each composite dielectric was evaluated by the following method. The results are shown in Table 3 and Table 4.

Evaluation Methods

Dielectric Property

Each of the obtained composite dielectrics was evaluated by an impedance analyzer for measuring its relative dielectric constant and dielectric dissipation factor.

(2) Heat Resistance Property

Each of the obtained composite dielectrics was evaluated by a thermal analyzer (TG-DTA analyzer) for measuring a weight loss ratio up to 300° C.

Moisture Absorption Property

Each of the obtained composite dielectrics was evaluated by a PCT test (at 135° C. and 3 atm for 2 hours) for measuring a moisture absorption ratio after the test.

TABLE 1

|  | Example 1 | Example 2 | Example 3 | Example 4 | Example 5 | Example 6 | Example 7 | Example 8 | Example 9 |
| --- | --- | --- | --- | --- | --- | --- | --- | --- | --- |
| Fluorinated aromatic polymer | Polymer (1) 10 parts | Polymer (2) 10 parts | Polymer (3) 10 parts | Polymer (1) 10 parts | Polymer (2) 10 parts | Polymer (1) 10 parts | Polymer (2) 10 parts | Polymer (2) 10 parts | Polymer (2) 10 parts |

TABLE 1-continued

|  | Example 1 | Example 2 | Example 3 | Example 4 | Example 5 | Example 6 | Example 7 | Example 8 | Example 9 |
|---|---|---|---|---|---|---|---|---|---|
| Organic solvent | Toluene 90 parts — | Toluene 90 parts — | Toluene 90 parts — | Toluene 90 parts — | Toluene 90 parts — | Toluene 90 parts — | Toluene 90 parts — | Toluene 67.5 parts NMP 22.5 parts | Toluene 67.5 parts NMP 22.5 parts |
| Dispersant | BYK W9010 0.7 parts | BYK W9010 0.7 parts | BYK W9010 0.7 parts | BYK W9010 0.8 parts | BYK W9010 1.0 part | BYK W9010 0.7 parts | BYK W9010 0.9 parts | BYK W9010 0.9 parts | BYK W9010 0 part |
| Inorganic dielectric | $BaTiO_3$ 70 parts | $BaTiO_3$ 70 parts | $BaTiO_3$ 70 parts | $BaTiO_3$ 80 parts | $BaTiO_3$ 100 parts | $SrTiO_3$ 70 parts | $BaTiO_3$ 90 parts | $BaTiO_3$ 90 parts | $BaTiO_3$ 90 parts |

$BaTiO_3$: 500 nm of average particle size, 2.2 $m^2/g$ of specific surface area $SrTiO_3$: 1.5 μm of average particle size, 7 $m^2/g$ of specific surface area BYK W9010: product name, product of BYK CHEMIE JAPAN INC.

TABLE 2

|  | Comparative Example 1 | Comparative Example 2 | Comparative Example 3 |
|---|---|---|---|
| Polymer | PTFE 17 parts | YD-127 5 parts MT-500 5 parts Triethylamine 0.03 parts | YD-127 5 parts MT-500 5 parts Triethylamine 0.03 parts |
| Organic solvent | — | Toluene 90 parts | Toluene 90 parts |
| Dispersant | — | BYK W9010 0.35 parts | BYK W9010 0.7 parts |
| Inorganic dielectric | $BaTiO_3$ 70 parts | $BaTiO_3$ 35 parts | $BaTiO_3$ 70 parts |

PTFE: polytetrafluoroethylene dispersion, 60% of solid matter concentration, product of DAIKIN INDUSTRIES, LTD.

YD-127: product name, Bisphenol A type epoxy resin, product of TOHTO KASEI CO., LTD.

MT-500: product name, methyl tetrahydrophthalic anhydride, product of NEW JAPAN CHEMICAL CO., LTD.

TABLE 3

|  | Example 1 | Example 2 | Example 3 | Example 4 | Example 5 | Example 6 | Example 7 | Example 8 | Example 9 |
|---|---|---|---|---|---|---|---|---|---|
| Film formability | Good | Good | Good | Good | Good | Good | Good | Good | Good |
| Relative dielectric constant(1 MHz) | 87.7 | 85.7 | 80.9 | 92.4 | 101.1 | 91.1 | 90.5 | 106.5 | 88.1 |
| tan δ (1 MHz) | 0.014 | 0.011 | 0.018 | 0.013 | 0.02 | 0.025 | 0.018 | 0.015 | 0.025 |
| Thermal weight loss ratio (%) | 0.7 | 0.6 | 0.8 | 0.6 | 0.5 | 0.9 | 0.4 | 0.7 | 0.2 |
| Moisture absorption ratio (%) | Not more than 0.1% | Not more than 0.1% | Not more than 0.1% | Not more than 0.1% | Not more than 0.1% | Not more than 0.1% | Not more than 0.1% | Not more than 0.1% | Not more than 0.1% |

TABLE 4

|  | Comparative Example 1 | Comparative Example 2 | Comparative Example 3 |
|---|---|---|---|
| Film formability | Poor | Good | Relatively poor |
| Relative dielectric constant(1 MHz) | Undetectable | 37.2 | 50.7 |
| tan δ (1 MHz) | Undetectable | 0.045 | 0.06 |
| Thermal weight loss ratio (%) | 0.9 | 2.0 | 1.5 |
| Moisture absorption ratio (%) | Not more than 0.1% | 1.5% | 1.2% |

As is clear from Table 3, the composite dielectrics obtained from the liquid compositions for a composite dielectric of Examples 1 to 9 were excellent in dispersibility of an inorganic dielectric in an organic polymer, had good film formability and, also, had high dielectric constants and low dielectric dissipation factors. Further, they exhibited desirable properties such as high heat resistance and low moisture absorption property for materials of electrical circuit substrates. The dielectric dissipation factor (tan δ) is a tangent of the phase difference δ(90°−θ) in the dielectrics. As the dielectric dissipation factor is higher, the electric energy is consumed more as heat energy; thus, energy loss and thermal deterioration attributed to the heat generation of the dielectrics tend to be caused.

On the other hand, as shown in Table 4, it is found that the formability such as the film formability was deteriorated when the inorganic dielectric was added in a large amount to improve the relative dielectric constant in the fluorinated resin of Comparative Example 1. In the case of epoxy resin in Comparative Examples 2 and 3, it was found difficult to add the inorganic dielectric in a large amount and the resin itself had low heat resistance and high moisture absorption; therefore, they exhibit inferior functions as the composite dielectrics.

The poor film formability means herein that film formation is impossible or although a film is formed, the film is fragile and cannot be kept in a film state by the reasons such as the viscosity of the liquid composition for a composite dielectric is improper or the dispersion state is inferior.

The invention claimed is:

1. A liquid composition for a composite dielectric, which comprises an inorganic dielectric and a fluorinated aromatic polymer, wherein the inorganic dielectric is dispersed in the fluorinated aromatic polymer, and wherein said inorganic dielectric is within a range of 700 to 2,000 parts by mass relative to 100 parts by mass of said fluorinated aromatic polymer, and wherein said fluorinated aromatic polymer includes the repeating units represented by the following formula (1);

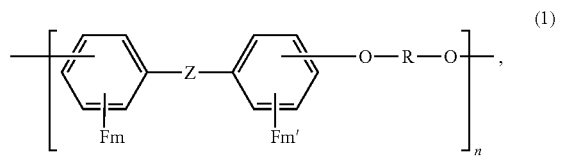

in the formula (1), R is same or different and is any one represented by the following structural formula groups (3) or an organic chain formed by combining these, Z is represented by the following structural formula (4-6),

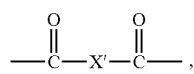

in the formula (4-6), X is a diphenyl ether chain, bisphenol A chain, bisphenol F chain or fluorene chain, m and m' respectively are same or different and each represents numbers of fluorine atoms bonded to the aromatic rings and are an integer of not less than 0 and m+m'=1 to 8, n represents the polymerization degree and is within a range of 2 to 5000, and wherein said structural formula groups (3) are selected from the group consisting of:

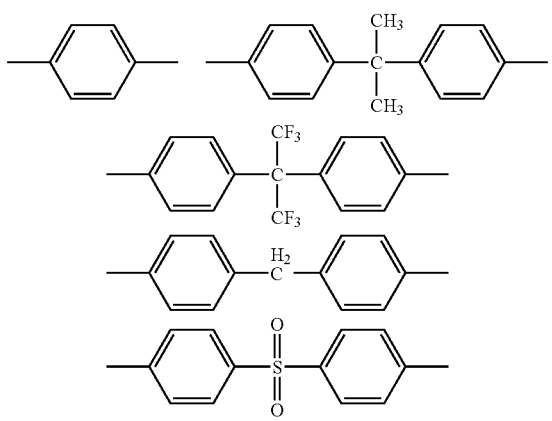

-continued

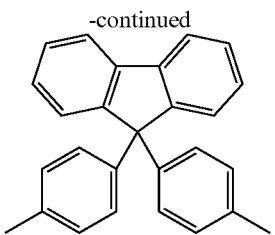

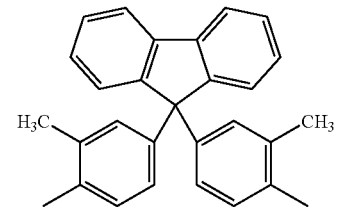

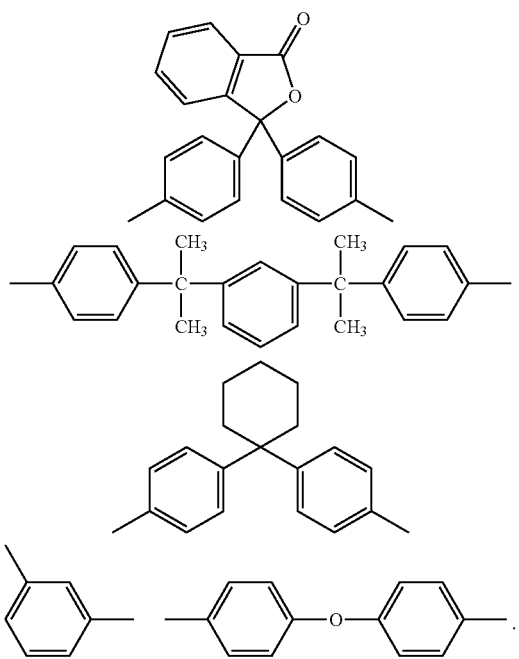

2. The liquid composition for a composite dielectric according to claim 1, wherein said fluorinated aromatic polymer has the structure derived from 9,9'-bis(4-hydroxyphenyl) fluorene.

3. A composite dielectric made of the liquid composition for a composite dielectric according to claim 1.

4. The composite dielectric according to claim 3, which has a relative dielectric constant within a range of 30 to 10,000.

5. The composite dielectric according to claim 4, which has a relative dielectric constant within a range of 60 to 10,000.

6. An electrical circuit substrate comprising the composite dielectric according to claim 3 as a constituent part.

7. An electrical circuit substrate comprising the composite dielectric according to claim 4 as a constituent part.

8. An electrical circuit substrate comprising the composite dielectric according to claim 5 as a constituent part.

9. A composite dielectric made of the liquid composition for a composite dielectric according to claim 2.

10. The composite dielectric according to claim 9, which has a relative dielectric constant within a range of 30 to 10,000.

11. The composite dielectric according to claim 9, which has a relative dielectric constant within a range of 60 to 10,000.

12. An electrical circuit substrate comprising the composite dielectric according to claim 9 as a constituent part.

* * * * *

UNITED STATES PATENT AND TRADEMARK OFFICE
CERTIFICATE OF CORRECTION

PATENT NO.      : 7,632,884 B2                               Page 1 of 1
APPLICATION NO. : 10/950454
DATED           : December 15, 2009
INVENTOR(S)     : Hayahide Yamasaki et al.

It is certified that error appears in the above-identified patent and that said Letters Patent is hereby corrected as shown below:

Claim 1, column 17, line 23 please amend the first formula as follows:

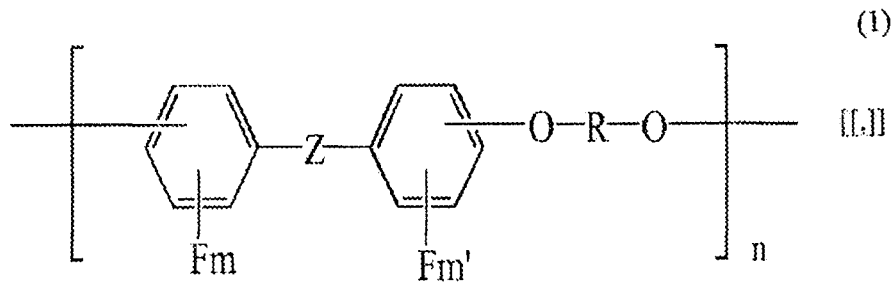

in the formula ...

In claim 1, column 17, line 35, please amend the second formula as follows:

in the formula ...

Signed and Sealed this

First Day of June, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,632,884 B2 | Page 1 of 1 |
| APPLICATION NO. | : 10/950454 | |
| DATED | : December 15, 2009 | |
| INVENTOR(S) | : Hayahide Yamasaki et al. | |

It is certified that error appears in the above-identified patent and that said Letters Patent is hereby corrected as shown below:

Claim 1, column 17, please amend line 30 as follows:

, in the formula ...

Claim 1, column 17, please amend line 41 as follows:

, in the formula ...

Signed and Sealed this

Fifth Day of October, 2010

David J. Kappos
*Director of the United States Patent and Trademark Office*